United States Patent [19]

Teraguchi et al.

[11] Patent Number: 5,734,688
[45] Date of Patent: Mar. 31, 1998

[54] INTERPOLATION PULSE GENERATING DEVICE WITH TWO-STEP INTERPOLATION

[75] Inventors: Mikiya Teraguchi; Kiyokazu Okamoto, both of Kawasaki, Japan

[73] Assignee: Mitutoyo Corporation, Tokyo, Japan

[21] Appl. No.: 549,143

[22] Filed: Oct. 27, 1995

[30] Foreign Application Priority Data

Nov. 8, 1994 [JP] Japan ................... 6-299010

[51] Int. Cl.$^6$ ................................................ G01B 7/00
[52] U.S. Cl. ................. 375/371; 377/24; 364/561; 364/723
[58] Field of Search .................... 375/371, 308; 332/102; 341/173; 327/3; 324/166; 377/3, 19, 24; 364/561, 562, 563, 565, 577, 723

[56] References Cited

U.S. PATENT DOCUMENTS

| 4,225,931 | 9/1980 | Schwefel. |
| 4,307,346 | 12/1981 | Kurosawa et al. ................. 327/3 |
| 4,814,704 | 3/1989 | Zerrien, Jr. et al.. |
| 5,067,089 | 11/1991 | Ishii et al.. |
| 5,123,742 | 6/1992 | Takizawa et al. ................. 356/358 |
| 5,218,295 | 6/1993 | Nakazato et al.. |
| 5,452,425 | 9/1995 | Childers et al.. |

FOREIGN PATENT DOCUMENTS

| A-0 414 953 | 3/1991 | European Pat. Off.. |
| A-0 543 421 | 5/1993 | European Pat. Off.. |
| A-0 584 595 | 3/1994 | European Pat. Off.. |

*Primary Examiner*—Stephen Chin
*Assistant Examiner*—Betsy L. Deppe
*Attorney, Agent, or Firm*—Oliff & Berridge, P.L.C.

[57] ABSTRACT

Signals $S_j$ and $S_{j-1}$ that are deviate from each other by a phase value of $2\pi/M$ are generated by combining two sinusoidal detection signals. A reference signal $\Delta S$ is generated which represents a difference between the signals $S_j$ and $S_{j-1}$. An up-pulse or a down-pulse is generated every time the signal $S_j$ or $S_{j-1}$ varies by $\Delta S/n$. An n-ary reversible ring counter outputs a first count value and a carry or borrow pulse by counting the up-pulse and the down-pulse, and the first count value is used to control the operation of generating the up-pulse or down-pulse. An M-ary reversible ring counter outputs a second count value by counting the carry pulse or the borrow pulse, and the second count value is used to control the operation of generating the signals $S_j$ and $S_{j-1}$.

6 Claims, 10 Drawing Sheets

FIG. 9
PRIOR ART $$C = \frac{V\sqrt{R_A^2 + R_B^2}}{R_A + R_B} \sin(\theta + \varnothing)$$

WHERE $\varnothing = \tan^{-1} \frac{R_A}{R_B}$

INTERPOLATION PULSE GENERATING DEVICE WITH TWO-STEP INTERPOLATION

BACKGROUND OF THE INVENTION

1. Field of the Invention

The present invention relates to an interpolation pulse generating device that is incorporated in a linear encoder, a rotary encoder, and like devices, and intends to realize high-speed operation, high accuracy, and high resolution with a smaller number of parts.

2. Description of the Related Art

Length-measuring devices such as a linear encoder and a rotary encoder are known in which a detector generates sinusoidal signals having the same spatial period and a predetermined spatial phase difference in accordance with relative movement between stationary and moving scales, and pulses of a number corresponding to the distance of the above relative movement are generated on the basis of the sinusoidal signals (detection signals). Length-measuring devices of the above type are commonly used in three-dimensional measuring apparatuses, machine tools, small-sized digital slide calipers, etc.

Figure 8:
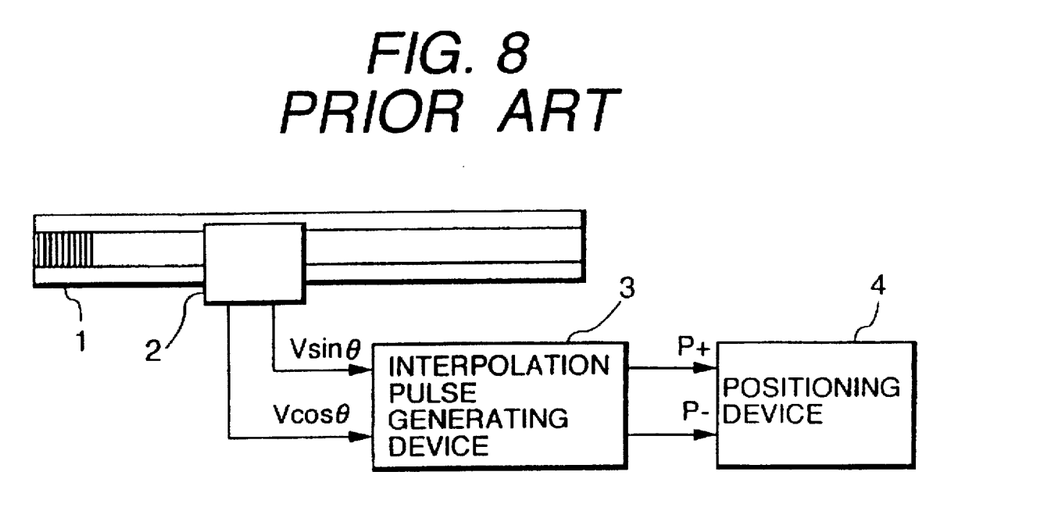
FIG. 8 shows a general configuration of a linear encoder.

FIG. 8 shows a linear encoder as an example of such length-measuring devices. This linear encoder consists of a scale 1, a detector 2 capable of sliding along the scale 1, an interpolation pulse generating device 3, and a positioning device 4. In actual implementation, the positioning device 4 is replaced by a counter or a NC positioning device including a counter of a three-dimensional measuring device or a NC machine tool. The detector 2 produces two cyclic detection signals (Vsinθ and Vcosθ in the example of FIG. 8) in accordance with relative movement between the scale 1 and the detector 2. Detecting a variation of the phase angle θ of the two detection signals, the interpolation pulse generating device 3 produces count-up pulses $P_+$ or count-down pulses $P_-$. The positioning device 4 recognizes the distance of the movement of the detector 2 relative to the scale 1 by counting the pulses $P_+$ or $P_-$.

Length-measuring devices of the above type are required to have a resolution that is higher than the resolution that is determined by the mechanical structure of the detector, which is the pitch of a grating formed on the scale in the case of a linear encoder. To this end, i.e., to improve the resolution of the length measurement, a phase angle variation of the detection signals that are output from the detector are detected in angular units that are smaller than one period, i.e., $2\pi$. This operation is hereinafter called "interpolation."

In recent years, it is increasingly required that the interpolation be improved in accuracy and processing speed as the need of high-resolution length measurement is increased in the microprocessing technology. In particular, in such fields as semiconductors, length measurements in the order of nanometer or sub-nanometer, not to mention sub-micrometer, are needed increasingly.

Usually, in the interpolation of a phase angle variation of the above-described detection signals, computation is performed on a combination of a plurality of input signals that have the same period and amplitude, have a predetermined phase difference, and vary symmetrically with respect to the zero level. Conventionally, the resistive division scheme is mainly used for this computation.

Figure 9:
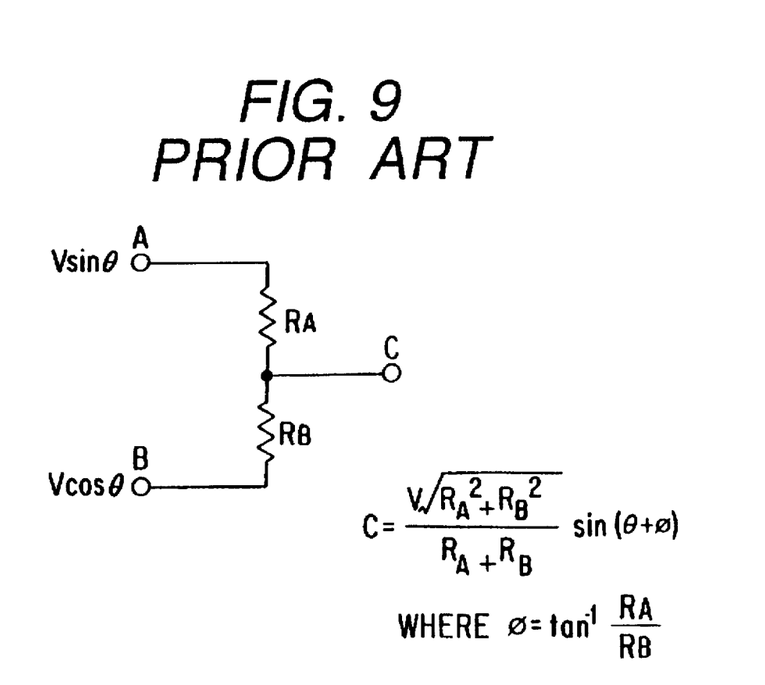
FIG. 9 shows the principle of the resistive division scheme.

The principle of the resistive division scheme will be described with reference to FIG. 9. When signals represented by Vsinθ and Vcosθ are respectively input to terminals A and B, a signal represented by $$C = \{V(R_A^2 + R_B^2)^{1/2}/(R_A + R_B)\} \sin(\theta + \phi) \quad (1)$$

where $$\phi = \tan^{-1}(R_A/R_B)$$

is output from terminal C. Therefore, a sine-wave signal that is advanced from the signal A by a predetermined phase angle φ can be obtained by properly determining resistances $R_A$ and $R_B$.

A desired number of circuits having the above configuration are provided. Among those circuits, one having the output signal C that is closest to 0 is selected and its output signal C is detected. For example, to realize an interpolation number 80, 40 circuits are needed to provide sine-wave signals whose φ values range from 0 to π with intervals of $2\pi/80$. That is, a large-sized circuit is needed which includes 40 comparators and 80 resistors. (Refer to Japanese Examined Patent Publication No. Sho. 62-33527.) Therefore, to increase the interpolation number in the resistive division scheme, the number of resistors and the circuit scale necessarily increase, to cause problems in the cost, size, power consumption, etc.

Japanese Examined Patent Publication No. Hei. 5-25285 discloses an improved version of the resistive division scheme, which consists of a coefficient storing element, a coefficient switching circuit, a multiplication-type D/A converter. According to this scheme, coefficients of cosφ and −sinφ with an arbitrary spatial phase φ are generated by use of the multiplication-type D/A converter. By performing a computation involving the above coefficients and the input signals Vsinθ and Vcosθ, a sine-wave signal that is delayed from the signal Vsinθ is obtained as follows:

$$V\sin\theta \cdot \cos\phi - V\cos\theta \cdot \sin\phi = V\sin(\theta - \phi) \quad (2)$$

The phase angle θ of the input signals can be detected by comparing the above computation result with the zero potential (i.e., a reference signal). However, to increase the interpolation number in this scheme, an expensive D/A converter of a large number of bits is needed, whose conversion speed is usually very slow. Due to the limitation of the slow conversion speed, the response speed of the interpolation pulse generating device is much reduced.

SUMMARY OF THE INVENTION

The present invention has been made in view of the above problems in the art, and has an object of providing, by using novel equations for computation, an interpolation pulse generating device which operates at high speed with high accuracy and resolution, and which has a smaller number of high-accuracy resistors and smaller high-speed circuits than the conventional device.

According to the invention, there is provided an interpolation pulse generating device that receives detection signals of a plurality of phases which signals are produced in accordance with a displacement of relative movement between corresponding members, and generates a count pulse for each predetermined phase angle pitch that is smaller than one period of the detection signals, comprising:

adjacent two phases selecting means for generating signals $S_j$ and $S_{j-1}$ that are deviate from each other by a phase value of $2\pi/M$ by combining the plurality of detection signals, where M is a fixed integer;

difference signal generating means for generating a reference signal ΔS that represents a difference between the signals $S_j$ and $S_{j-1}$; and comparing means for generating an up-pulse or a down-pulse every time the signal $S_j$ or $S_{j-1}$ varies by ΔS/n where n is a fixed integer in a phase section of $2\pi/M$ in which the signals $S_j$ and $S_{j-1}$ have values existing on both sides of 0.

In the invention, the two kinds of interpolation means, i.e., the M-interpolation means and the n-interpolation means are provided to realize M×n interpolation. A simple configuration can be obtained without using an unduly large number of resistors, comparators, etc. In a first embodiment, the n-interpolation is performed by using analog circuits. In a second embodiment, it is performed digitally by using an A/D converter.

DESCRIPTION OF THE PREFERRED EMBODIMENTS

Preferred embodiments of the present invention will be hereinafter described with reference to the accompanying drawings.

Figure 1:
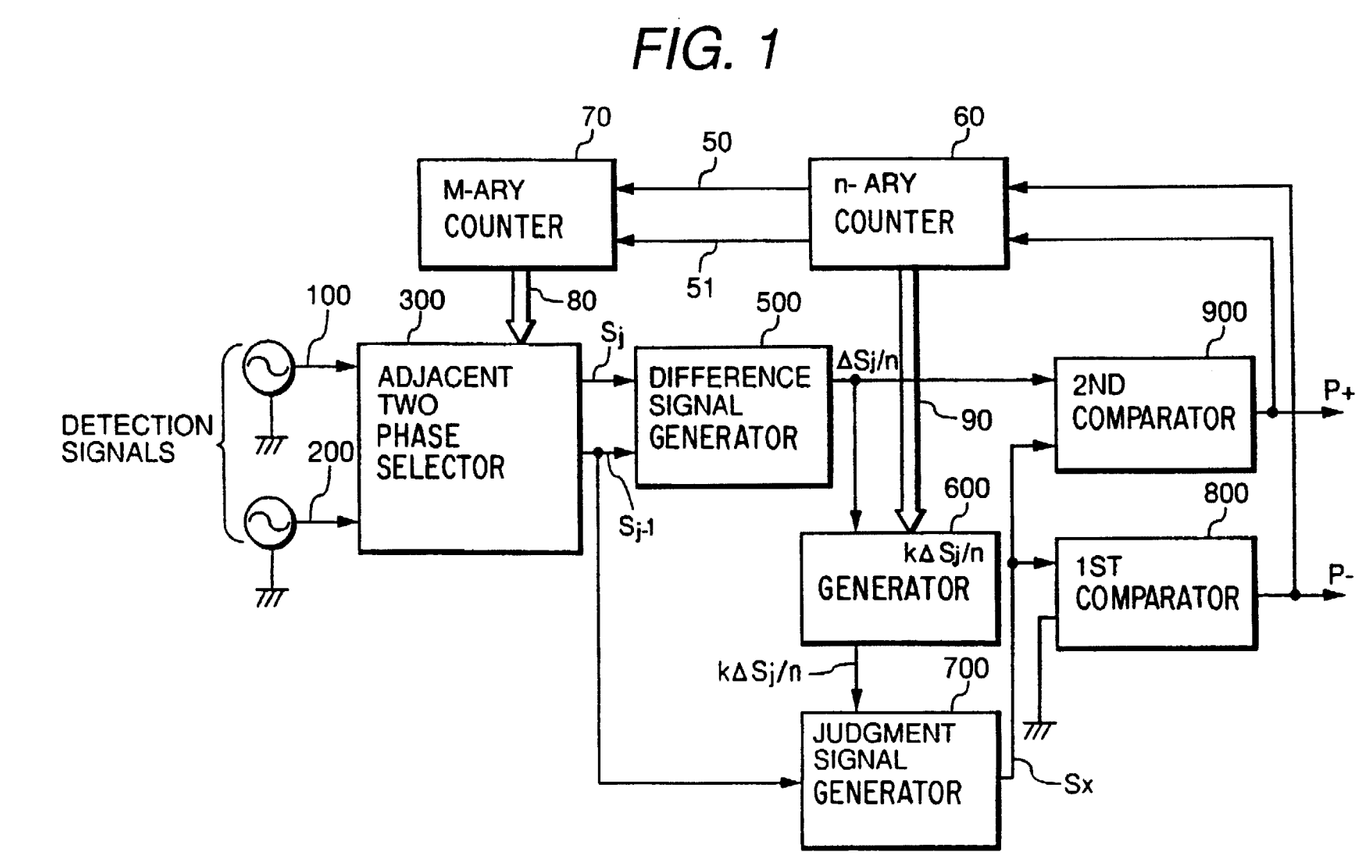
FIG. 1 is a block diagram showing a general configuration of an interpolation pulse generating device according to an embodiment of the present invention.

FIG. 1 shows a circuit configuration of an interpolation pulse generating device according to an embodiment of the invention. An adjacent two phase selector 300 receives a detection signal 100 (V sinθ in this embodiment) and a detection signal 200 (V cosθ in this embodiment) that always deviates from the detection signal 100 by a predetermined phase angle. Based on the detection signals 100 and 200, the adjacent two phase selector 300 divides one period $2\pi$ of the phase angle of the detection signals 100 and 200 into M parts, to produce two signals $S_j$ and $S_{j-1}$ (j=1, 2, . . . , M) that deviate from each other by a phase angle of $2\pi/M$.

Figure 2:
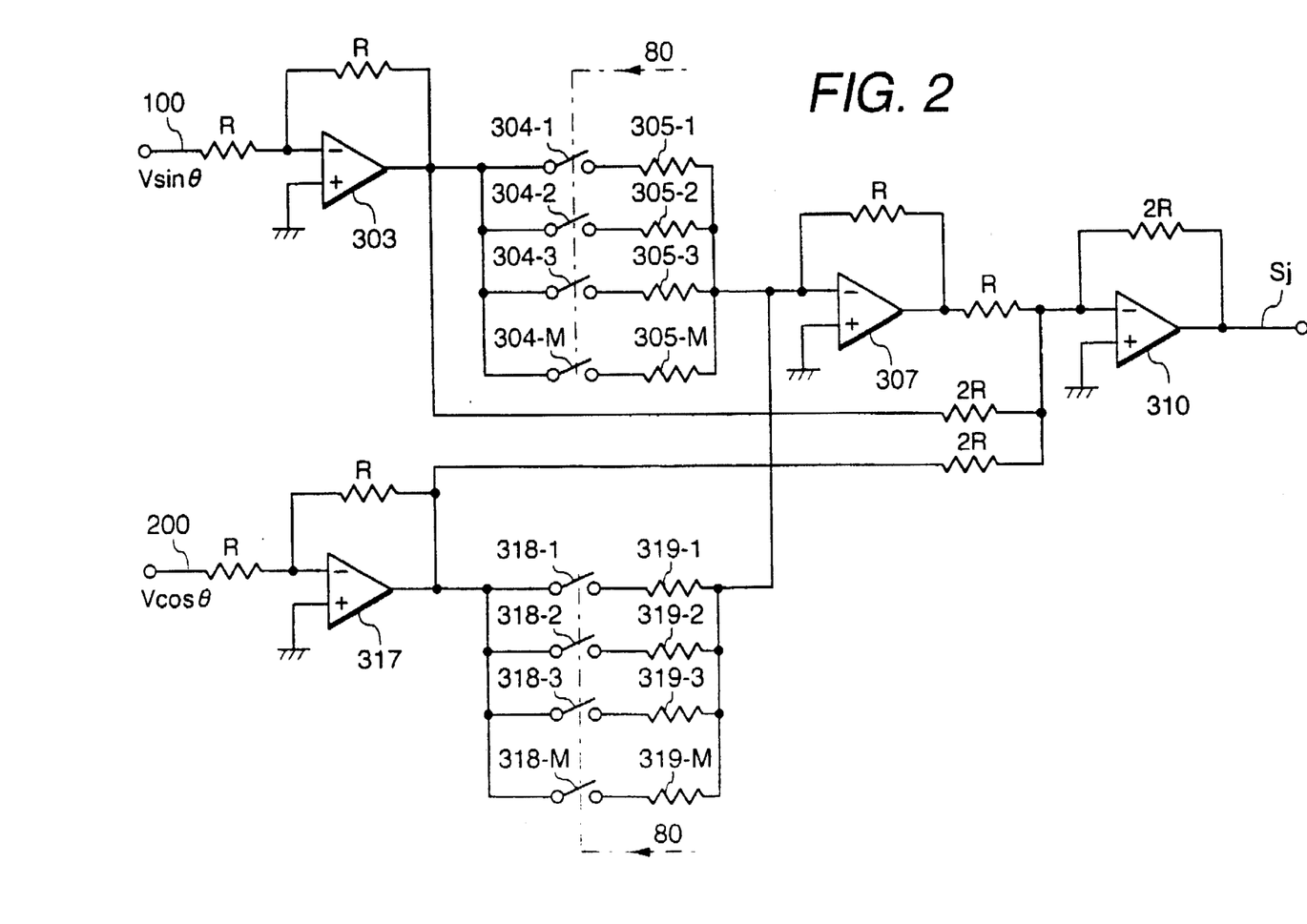
FIG. 2 is a circuit diagram of an adjacent two phase selector used in the device of FIG. 1.

In this embodiment, the adjacent two phase selector includes means for generating sine-wave signals of M phases and means for selecting adjacent signals. FIG. 2 shows a preferred example of a circuit of the selector 300. This circuit generates only one of the signals $S_j$ and $S_{j-1}$, but a circuit for generating the other signal can be constructed in the same manner with an exception that the orders of resistors (described below) are shifted by one.

Referring to FIG. 2, the configuration and operation of the selector 300 will be described.

The circuit of FIG. 2 consists of an inverting amplifier 303 receiving the detection signal 100, parallel-connected analog switching elements 304-1 to 304-M, resistors 305-1 to 305-M that are connected in series to the respective analog switching elements 304-1 to 304-M, an inverting amplifier 317 receiving the detection signal 200, parallel-connected analog switching elements 318-1 to 318-M, resistors 319-1 to 319-M that are connected in series to the respective analog switching elements 318-1 to 318-M, and inverting amplifiers 307 and 310. One of the resistors 305-1 to 305-M and one of the resistors 319-1 to 319-M (for instance, the resistors 304-1 and 318-1 or the resistors 304-2 and 318-2) are selected by the analog switching elements 304-1 to 304-M and 318-1 to 318-M in accordance with an output signal 80 of an M-ary counter (M-ary reversible ring counter) 70. The selected resistors and the inverting amplifier 307 constitute a two-input addition type variable gain amplifier.

The resistances of the resistors 305-1 to 305-M are represented by $R_{11}$ to $R_{1M}$ and the resistances of the resistors 319-1 to 319-M are represented by $R_{21}$ to $R_{2M}$. In accordance with the signal 80 supplied from the M-ary counter 70 and indicating an integer j, analog switching elements 304-j and 318-j are turned on. In this state, an output signal of the inverting amplifier 307 is obtained as follows:

$$R \cdot V \sin \theta / R_{1j} + R \cdot V \cos \theta / R_{2j} \qquad (3)$$

An output $S_j$ of the inverting amplifier 310 is equal to an inverted sum of the output signal of the inverting amplifier 307 multiplied by 2, the output signal of the inverting amplifier 303 ($-V\sin\theta$), and the output signal of the inverting amplifier 317 ($-V\cos\theta$). That is, $$S_j = V[\{1-(2R/R_{1j})\} \sin\theta + \{1-(2R/R_{2j})\} \cos\theta] = V[\{1-(2R/R_{1j})\}^2 + \{1-(2R/R_{2j})\}^2]^{1/2} \sin(\theta+\phi) \qquad (4)$$

where $$\phi = \tan^{-1}\{(1-2R/R_{2j})/(1-2R/R_{1j})\}.$$

Therefore, one of M-phase signals having phase angle intervals of $2\pi/M$ can be selected by setting the resistances $R_{11}$ t $R_{1M}$ and $R_{21}$ to $R_{2M}$ so that $\phi$ values have intervals of $2\pi/M$, i.e., so that $(1-2R/R_{1j})$ in Equation (4) becomes equal to a coefficient $\cos(2\pi j/M)$ (j=1, 2, . . . , M) and $(1-2R/R_{2j})$ in Equation (4) becomes equal to a coefficient $-\sin(2\pi j/M)$ (j=1, 2, . . . , M). Further, the M-phase signals have the same amplitude as is understood from Equation (4) which includes a square root of a sum of $\cos^2$ and $\sin^2$. That is, $$S_j = C_j \sin(\theta - 2\pi j/M) \qquad (5)$$

where $C_j$ represents the amplitude and j=1, 2, . . . , M.

A signal $S_{j-1}$, which deviates from $S_j$ by a phase angle of $2\pi/M$, is obtained by using the same configuration as shown in FIG. 2 with an exception that the order of the resistors 305 and the resistors 319 are shifted by one and selecting among the analog switching elements 304 and 318 in accordance with the signal 80 that is supplied from the M-ary counter 70. That is, $$S_{j-1} = C_{j-1} \sin\{\theta - 2\pi(j-1)/M\} \qquad (6)$$

where $C_{j-1}$ represents the amplitude and j=1, 2, ..., M. When j=1, $S_{j-1}$ is made $S_M$.

It is noted that in Equations (5) and (6) a relationship $C_j = C_{j-1}$ holds.

Figure 5:
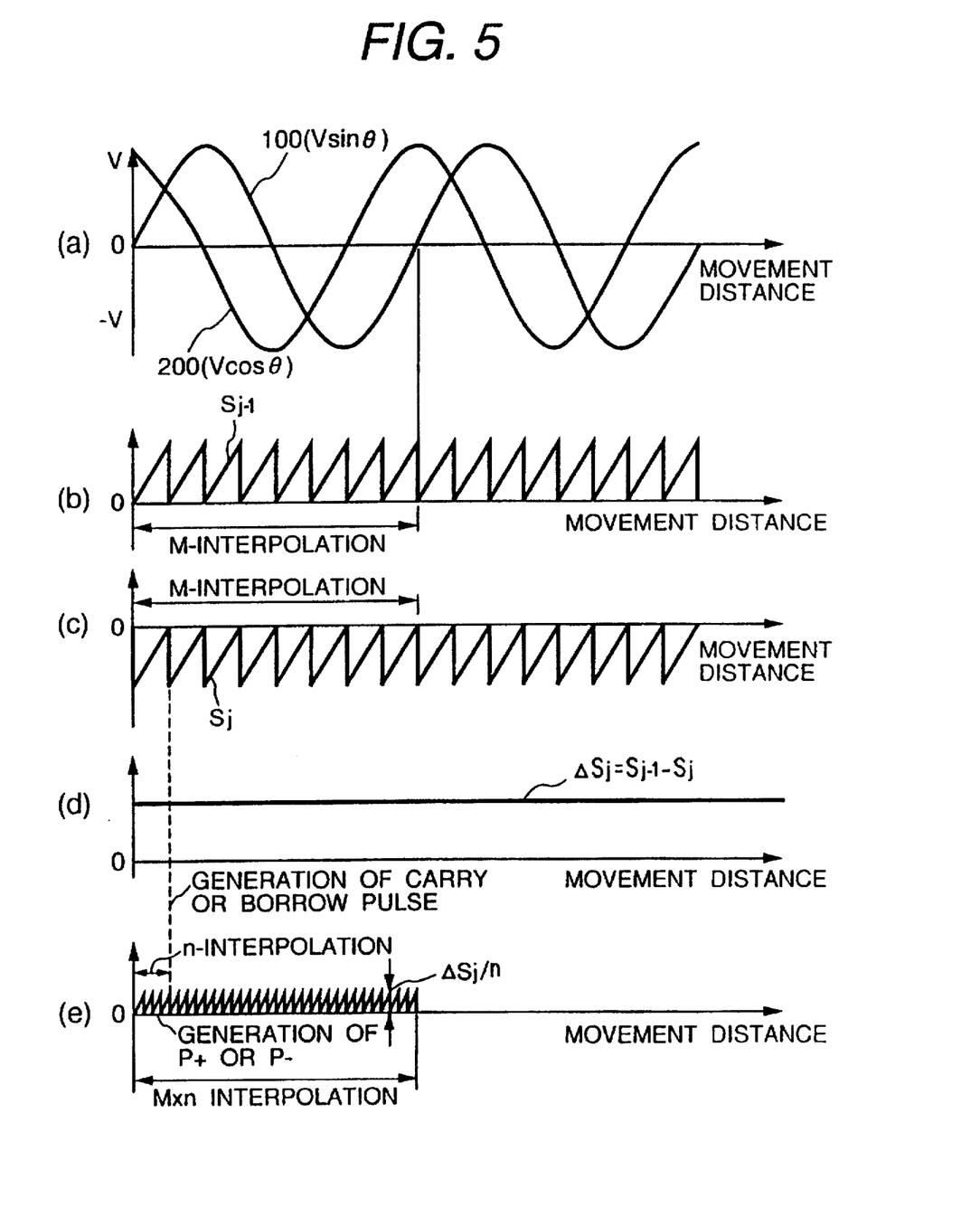
FIG. 5 is a timing chart of respective signals in the device of FIG. 1.

FIG. 5 is a timing chart of the respective signals. For convenience of description, it is assumed that the input signals 100 and 200 have a spatial phase difference of 90°, that the phase angle θ representing the movement distance varies linearly, and that M=8 and n=4. It goes without saying that the invention is not limited to such a specific case. In parts (a) to (e) of FIG. 5, the vertical axes represent voltages and the horizontal axes represent the movement distance. As the phases of the signals 100 and 200 advance by 2 π/8 (see part (a) of FIG. 5), each of the signal $S_{j-1}$ (see part (b) of FIG. 5) and the signal $S_j$ (see part (c) of FIG. 5) forms a triangle in the vicinity of the zero level.

Figure 3:
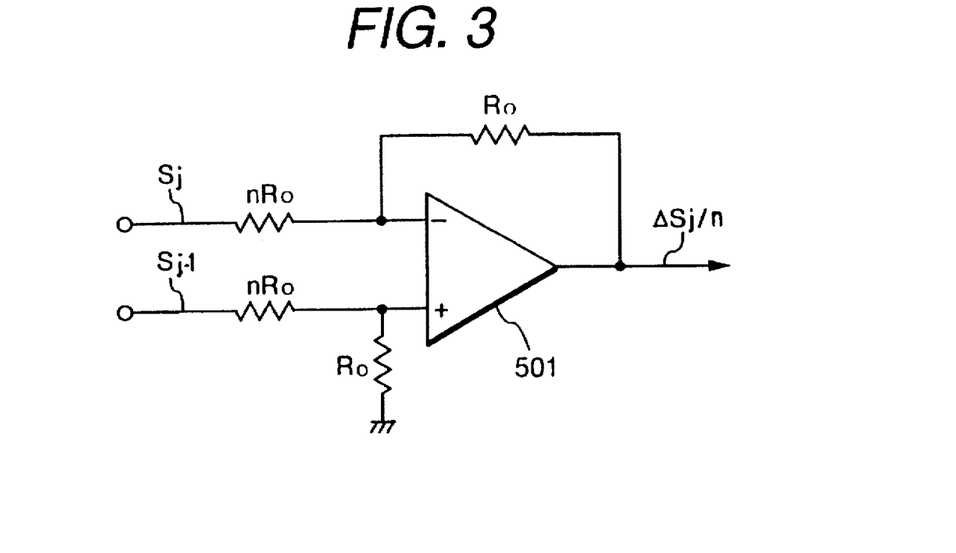
FIG. 3 is a circuit diagram of a difference signal generator means used in the device of FIG. 1.

The signals $S_{j-1}$ and $S_j$ are input to a difference signal generator 500 (see FIG. 3), which produces a difference signal ΔS/n according to Equation (7):

$$\Delta S_j/n = (S_{j-1} - S_j)/n \qquad (7)$$

In FIG. 3, $nR_0$ and $R_0$ represent resistances and reference numeral 501 denotes an operational amplifier. As shown in part (d) of FIG. 5, the value of $\Delta S_j$ is almost constant.

Figure 4:
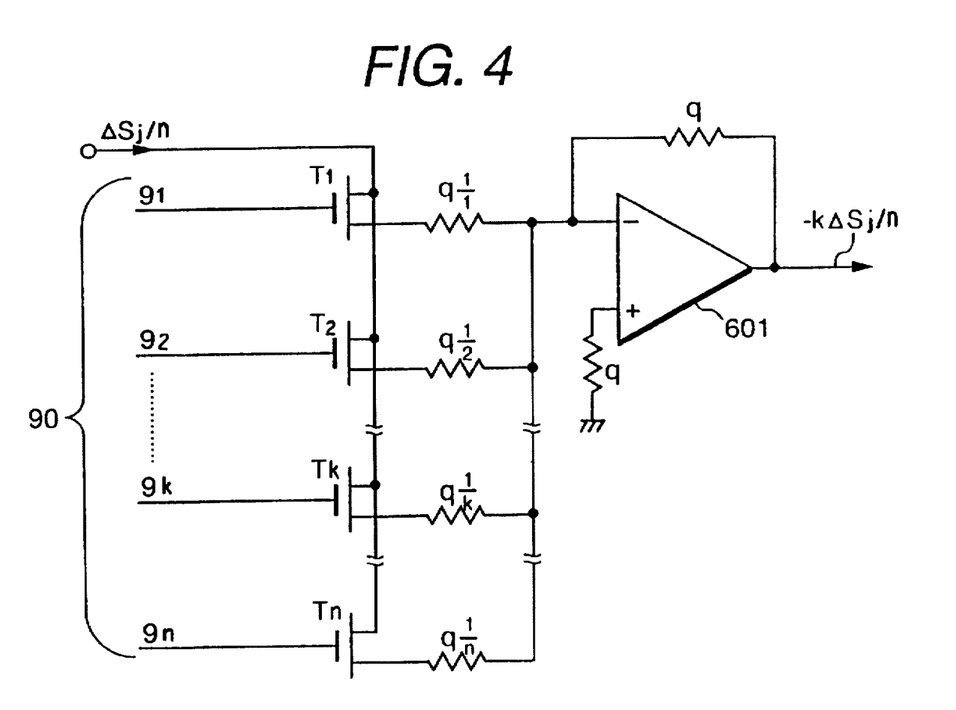
FIG. 4 is a circuit diagram of a judgment signal generator used in the device of FIG. 1.

The difference signal ΔS/n is input to a kΔS/n generator 600. FIG. 4 shows a specific circuit configuration of the generator 600. Output signals 90 ($9_1, 9_2, ..., 9_k, ..., 9_n$) of an n-ary counter (n-ary reversible ring counter) 60 are supplied to analog switching elements $T_1, T_2, ..., T_k, ..., T_n$ as control signals for determining conduction/non-conduction thereof so that one of the switching elements $T_1-T_n$ is made conductive and the other ones are made non-conductive. In FIG. 4, only the analog switching element $T_k$ is in a conductive state. A resistor having a resistance (1/k)q is provided between the analog switching element $T_k$ and an operational amplifier 601, which has a resistor having a resistance q. In this state, the operational amplifier 601 produces an output signal −kΔS/n.

The signals −kΔS/n and $S_{j-1}$ are input to a judgment signal generator 700, which performs computation and produces a judgment signal $S_x$ according to Equation (8):

$$S_x = S_{j-1} - k\Delta S/n = S_{j-1} - (k/n)(S_{j-1} - S_j) = \{kS_j + (n-k)S_{j-1}\}/n \qquad (8)$$

Figure 6:
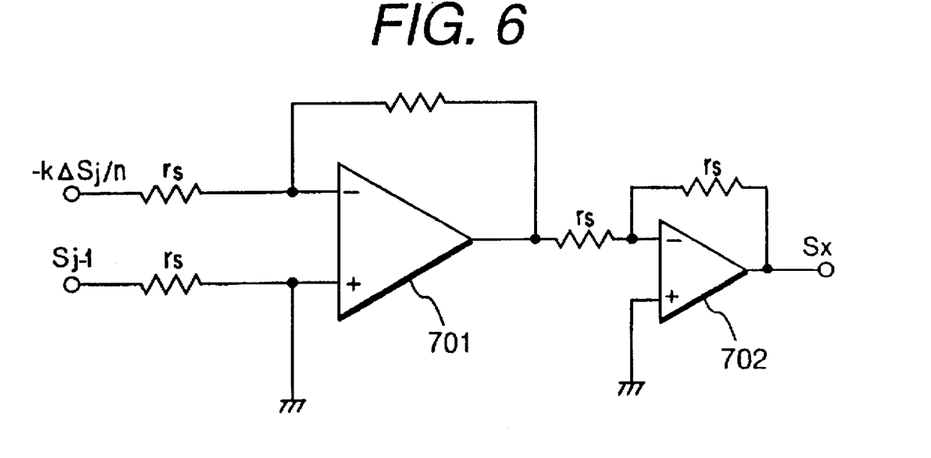
FIG. 6 is a circuit diagram of a $k\Delta S_j/n$ generator used in the device of FIG. 1.

FIG. 6 shows a specific circuit configuration of the judgment signal generator 700. In FIG. 6, $r_s$ denotes resistors, and numerals 701 and 702 denote operational amplifiers.

Referring to FIG. 1, the signal $S_x$ is input to first and second comparator 800 and 900. The first comparator 800 compares $S_x$ and 0, and the second comparator 900 compares $S_x$ and ΔS/n.

Figure 7:
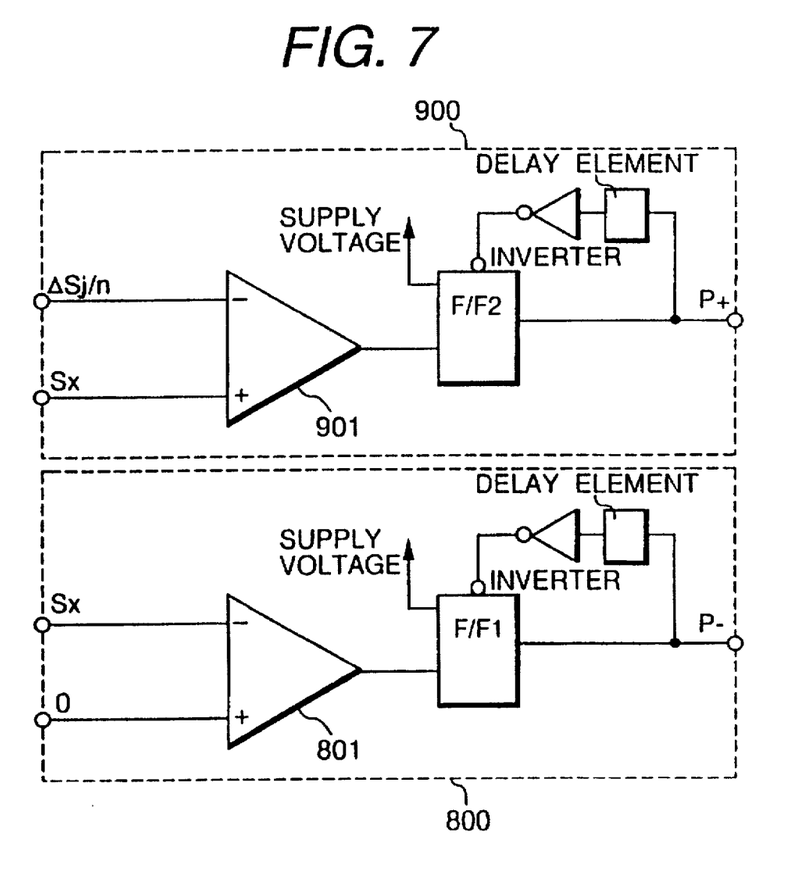
FIG. 7 is a circuit diagram of first and second comparators used in the device of FIG. 1.

FIG. 7 shows specific circuit configurations of the comparators 800 and 900. In FIG. 7, reference numerals 801 and 901 denote comparators, and F/F1 and F/F2 denote flip-flops. The output of the flip-flop F/F1 or F/F2 changes from "0" to "1" at a rising edge of a 0-to-1 change of the output of the comparator 801 or 901 in response to a change of the signal $S_x$. The n-ary counter 60 counts up or down at a rising edge of a 0-to-1 change of the output of the flip-flop F/F1 or F/F2. The analog switching elements $T_1-T_n$ of the kΔS/n generator 600 are switched in accordance with the output signals 90 of the n-ary counter 60. Further, by making the CL input of the flip-flop F/F1 or F/F2 negative with a certain delay by use of a delay element, the output thereof changes from "1" to "0". Thus, pulses $P_+$ and $P_-$ can be generated. By providing a delay, spike noise can be neglected which occurs at switching of the analog switching elements $T_1-T_n$.

Referring to FIG. 1, now consider a case where the detection signals 100 and 200 vary in one direction, $S_j$ and $S_{j-1}$ vary accordingly, and thereby transition is made from a state of $S_x > 0$ to a state of $S_x < 0$. At this time, an output pulse $P_-$ is obtained from the first comparator 800. When the pulse $P_-$ is input to the n-ary counter 60, the analog switching elements $T_1-T_n$ are switched in response to a transition of k→k−1, so that a state of $S_x > 0$ is established. Where the detection signals 100 and 200 vary in the other direction, $S_j$ and $S_{j-1}$ vary accordingly, and thereby transition is made from a state of $S_x < \Delta S/n$ to a state of $S_x > \Delta S/n$. At this time, an output pulse $P_+$ is obtained from the second comparator 900. When the pulse $P_+$ is input to the n-ary counter 60, a state of $S_x < \Delta S/n$ is re-established in response to a transition of k→k+1.

As the transition of k→k+1 or k→k−1 is repeated, a carry pulse 50 or a borrow pulse 51 is generated by the n-ary counter 60 and input to the M-ary counter 70, where a transition of j→j+1 or j→j−1 is effected. By constituting a feedback loop so as to change k and j in the above manner, $S_x$ can always satisfy $S_x > 0$ and $S_x < \Delta S/n$.

In the event that the decremented integer k is equal to 0, n is substituted into k and a borrow pulse is output. If the incremented integer k is equal to n+1, 1 is substituted into k and a carry pulse is output. Similarly, if the decremented integer j is equal to 0, M is substituted into j and when the incremented integer j is equal to M+1, 1 is substituted into j.

Although in the above embodiment the feedback loop is so formed that the signal $S_x$ always satisfy $S_x > 0$ and $S_x < \Delta S/n$, a feedback loop may be so formed that the signal $S_x$ always satisfy $S_x < 0$ and $S_x > -\Delta S/n$.

Part (e) of FIG. 5 shows how $S_x$ varies so as to satisfy $S_x > 0$ and $S_x < \Delta S/n$ while a pulse $P_+$ or $P_-$ is generated. since a sine wave is regarded as approximately straight in the vicinity of a phase 0°, the signal $\Delta S_j = S_{j-1} - S_j$ can be regarded as approximately constant in a phase range of 2 π/M including 0° if the division number M is sufficiently large. Thus, $\Delta S_j$ or $\Delta S_j/n$ can be used as a reference signal for the comparison.

Next, an interpolation pulse generating device according to a second embodiment of the invention will be described. While in the above embodiment the division by n is an analog operation, in this embodiment it is performed digitally.

Figure 10:
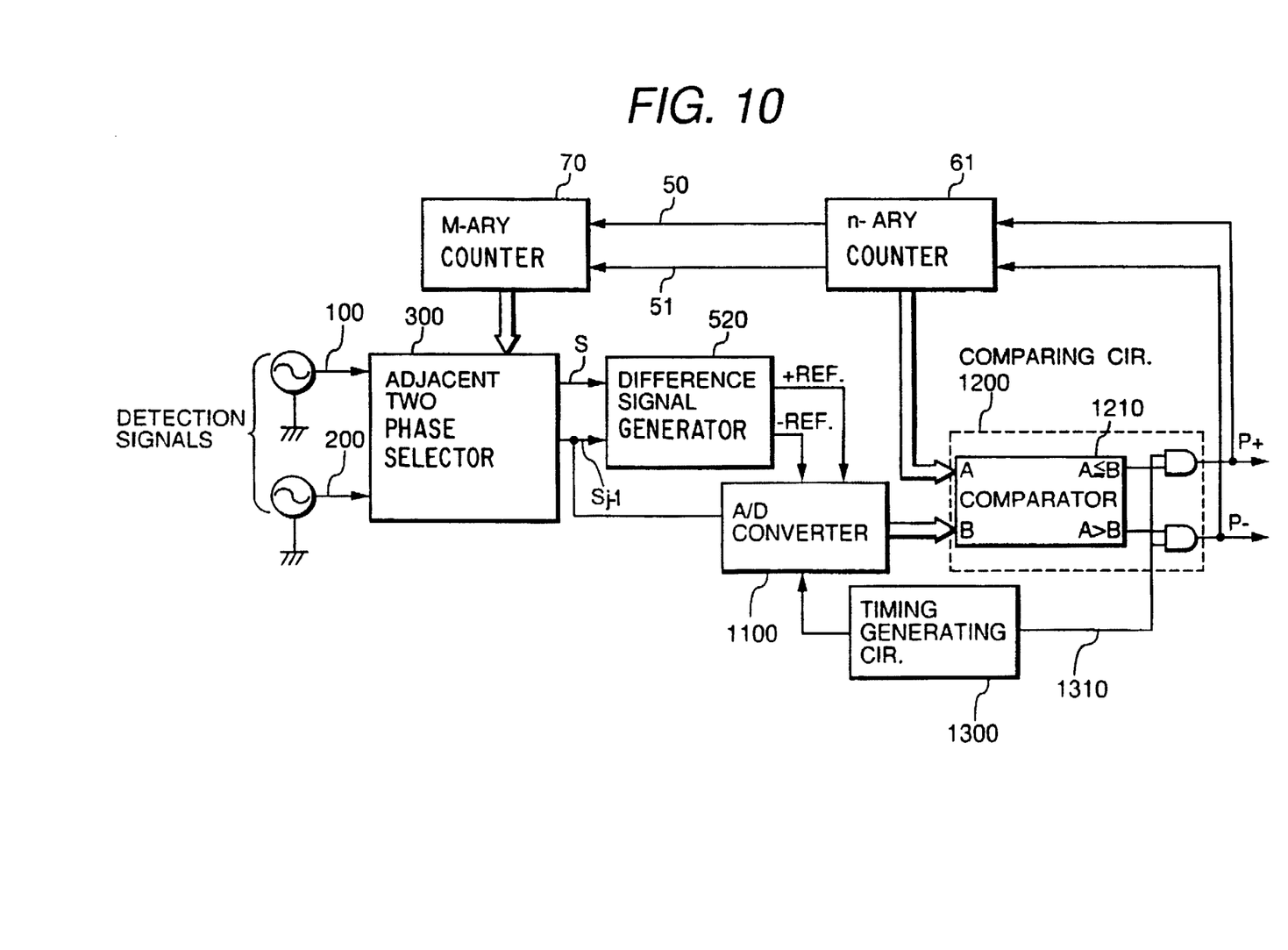
FIG. 10 is a block diagram showing a general configuration of an interpolation pulse generating device according to a second embodiment of the invention.

FIG. 10 shows the entire configuration of the interpolation pulse generating device of this embodiment. Since the M-ary counter 70 and the adjacent two phases phase selector 300, which together perform the M-division operation, are the same as those in the above embodiment (see FIG. 1), the following description is dedicated to the digital n-division technique.

The signals $S_j$ and $S_{j-1}$ are supplied from the adjacent two phase selector 300 to a difference signal generator 520, which produces a signal $\Delta S_j$ and an inverted signal $-\Delta S_j$ according to Equation (9):

$$\Delta S_j = S_{j-1} \qquad (9)$$

The signals $\Delta S_j$ and $-\Delta S_j$ are input to an A/D converter 1100 as positive and negative references, respectively. The A/D converter 1100 constitutes a bipolar A/D converter.

Figure 11:
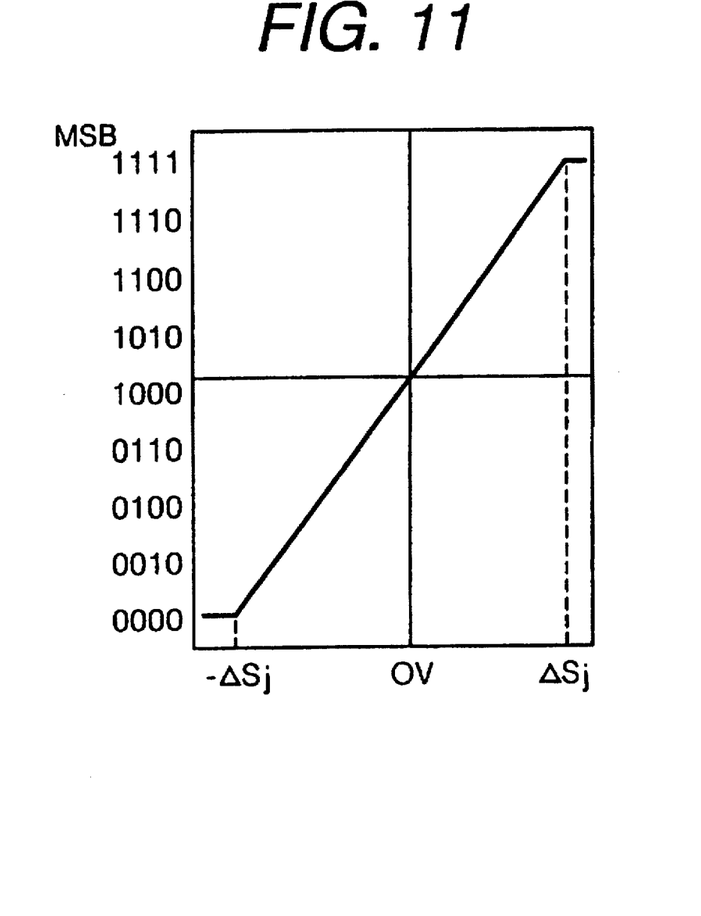
FIG. 11 is a graph showing a relationship between an input signal and output data of an A/D converter used in the device of FIG. 10.

FIG. 11 shows a relationship between an input voltage and output data of the A/D converter 1100. For simplicity, only upper 4 bits of output data are shown in FIG. 11.

The output signal $S_{j-1}$ of the adjacent two phase selector 300 is converted into a digital code by the A/D converter 1100 according to the relationship of FIG. 11. The digitized signal $S_{j-1}$ is input to a comparing circuit 1200, where it is compared with the value of a signal supplied from an n-ary counter 61. Now the inputs from the n-ary counter 61 and the A/D converter 1100 are represented by A and B, respectively. The comparing circuit 1200 makes the A>B output "true" when A>B, and makes the A≦B output "true" when A≦B. The A>B output and the A≦B output are ANDed with a timing signal 1310 from a timing generating circuit 1300, so that a pulse $P_+$ or $P_-$ is produced.

The n-ary counter 61 is an up/down reversible counter. When receiving a pulse $P_+$ from the comparing circuit 1200, the n-ary counter 61 changes its count value from k to k+1. The input A of the comparator 1210 is updated accordingly, and compared with the input B at the next timing. When receiving a pulse $P_-$ from the comparing circuit 1200, the n-ary counter 61 changes its count value from k to k−1.

As the transition of k→k+1 or k→k−1 is repeated, a carry pulse 50 or a borrow pulse 51 is generated and input to the M-ary counter 70. As a result, the M-ary counter 70 changes its count value j to j+1 or j−1. By constituting a feedback loop so as to change k and j in the above manner, the count pulses $P_+$ and $P_-$ can be generated so as to follow the phase angle variations of the detection signals 100 and 200.

Figure 12:
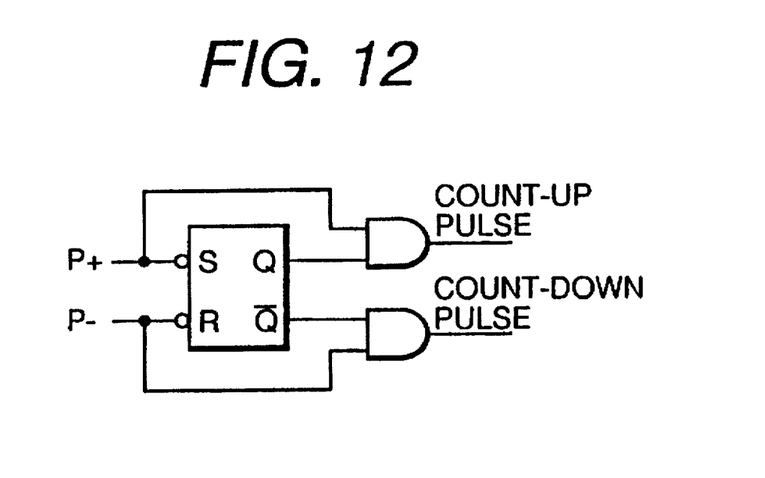
FIG. 12 is a circuit diagram of a damper circuit that may be used in the device of FIG. 10.

It is noted that unnecessary count pulses $P_+$ and $P_-$ are always generated alternately even if no change occurs in the detection signals 100 and 200. This phenomenon can be prevented by adding a damper circuit as shown in FIG. 12. That is, the damper circuit outputs a count-up or count-down pulse only when pulses $P_+$ or $P_-$ are produced consecutively.

Next, the respective components shown in FIG. 10 will be described with an assumption that the division value n of the n-ary counter 61 is 4. Further, as mentioned above, FIG. 11 shows only upper 4 bits of output data of the A/D converter 1100 and plots a straight line, though actually the output data are discrete. Since n is equal to 4, it is assumed that the n-ary counter 61 is a 2-bit binary reversible counter. It is also assumed that the A/D converter 1100 and the comparator 1210 deal with x+1-bit data.

Figure 14:
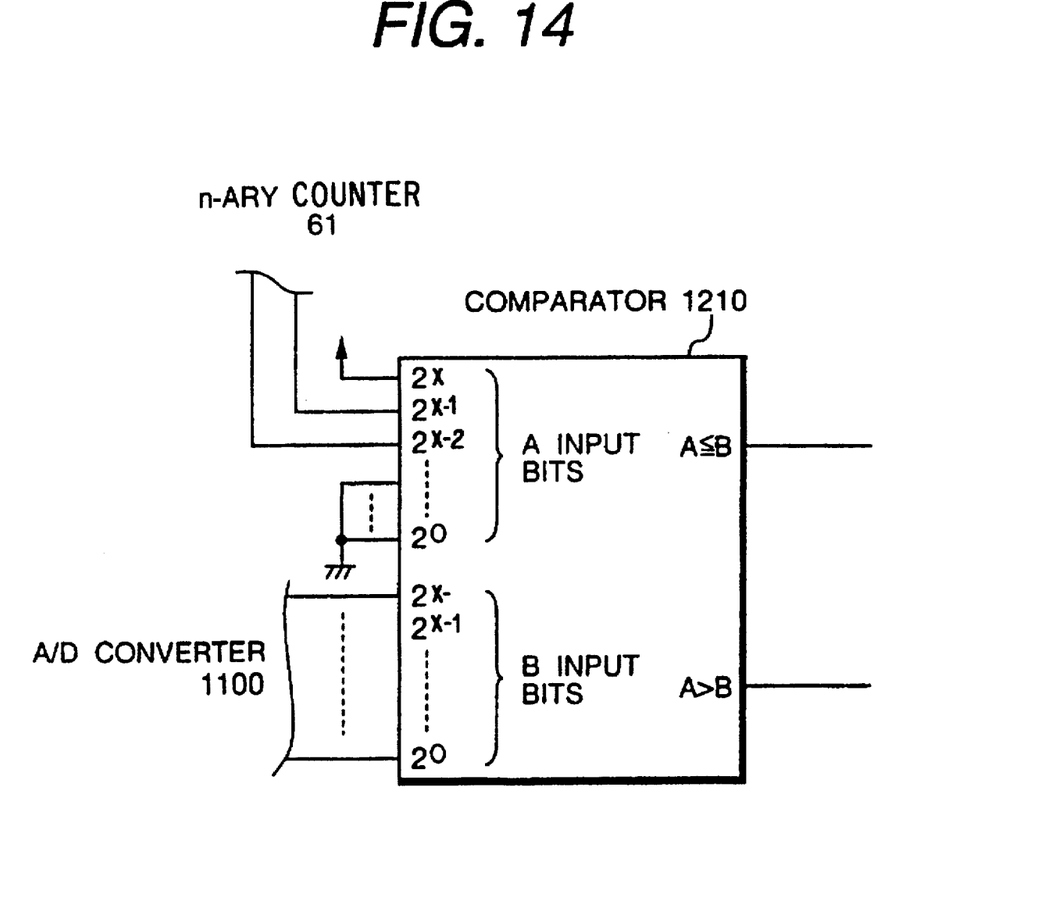
FIG. 14 shows connection between a comparator and each of the A/D converter and an n-ary counter, all of which are used in the device of FIG. 10.

FIG. 14 shows how each of the A/D converter 1100 and the n-ary counter 61 is connected to the comparator 1210. The bits of the A/D converter 1100 and those of the comparator 1210 (B input bits) are in one-to-one correspondence. As for the input terminals (A input bits) of the comparator 1210 for the n-ary counter 61, the $2^x$ bit is always set "true" (has a value "1"), the $2^{x-1}$ bit and the $2^{x-2}$ bit are allocated to the 2-bit input from the n-ary counter 61, and the remaining lower bits are always set "false" (has a value "0").

Figure 13:
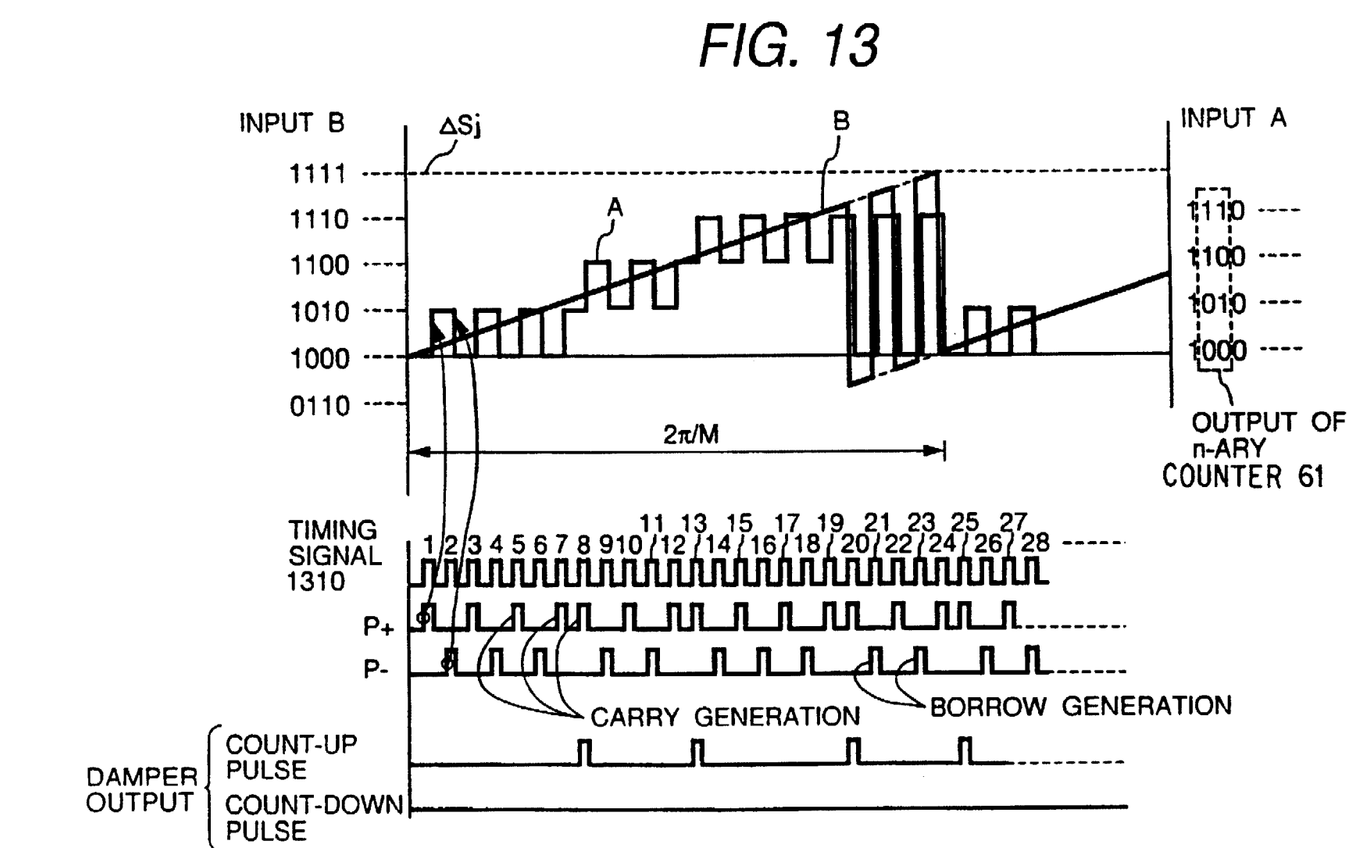
FIG. 13 is a timing chart showing the operation of the device of FIG. 10.

The operation of the interpolation pulse generating device will be described with reference to FIG. 13. It is assumed that at first the signal $S_{j-1}$ as digitized by the A/D converter 1100 is $(1000 \ldots )_2$, i.e., 0 V, and the count value k of the n-ary counter 61 is $(00)_2$, and that the phase angles of the detection signals 100 and 200 vary at a constant rate. In this case, as indicated by symbol B in FIG. 13, the output of the A/D converter 1100, i.e., the input B of the comparing circuit 1200 increases with an approximately constant slope in a phase section of $2\pi/M$.

The comparing circuit 1200 compares the input B with the input A, i.e., the output of the n-ary counter 61 in synchronism with the timing signal 1310 that is supplied from the pulse generating circuit 1300.

At the first timing, since A<B, a pulse $P_+$ is produced and the count value of the n-ary counter 61 changes from $(00)_2$ to $(01)_2$. At the second timing, since A>B, a pulse $P_-$ is produced and the count value of the n-ary counter 61 changes from $(01)_2$ to $(00)_2$. In this manner, the comparing circuit 1200 outputs a pulse $P_+$ or $P_-$ based on the result of comparison between the output values of the A/D converter 1100 and the n-ary counter 61.

At the 20th, 22nd or 24th timing, the count value of the n-ary counter 61 changes from $(11)_2$ to $(00)_2$. At this time, the n-ary counter 61 produces a carry pulse 50, so that the count value of the M-ary counter 70 changes from j to j+1. At the 21st or 23rd timing, the count value of the n-ary counter 61 changes from $(00)_2$ to $(11)_2$. At this time, the n-ary counter 61 produces a borrow pulse 51, so that the count value of the M-ary counter 70 changes from j to j−1.

If the decremented integer k in the n-ary counter is smaller than 0, n−1 is substituted into k and a borrow pulse is output and if the incremented integer k is equal to n, then 0 is substituted into k. Similarly, if the decremented integer j is equal to 0, then M is substituted into j and if the incremented integer j is equal to M+1 then 1 is substituted into j.

If the damper circuit of FIG. 12 is added as described above, alternately-output pulses $P_+$ and $P_-$ do not take effect. That is, a count-up or count-down pulse is output only when pulses $P_+$ or $P_-$ are produced consecutively as at the 7th and 8th timings. It is understood that one period obtained by the M-division is further divided into 4 parts.

In this embodiment, n is assumed to be 4, and therefore the n-ary counter 61 is a 2-bit binary reversible counter. Further, the $2^x$ bit of the A input bits of the comparator 1210 is always set "true" (has a value "1") and the output of the n-ary counter 61 is supplied to the $2^{x-1}$ and $2^{x-2}$ bit terminals. The above embodiment can easily accommodate a case where n is larger than 4 by changing the connection for the input A of the comparator 1210 as long as n is a certain power of 2.

A description will now be made of why the reference signal is obtained by performing a computation on the input signals, i.e., detection signals Vsinθ and Vcosθ. It may be conceived to simply use a constant voltage generator or the like instead of the reference signal $\Delta S_j$, which is approximately constant theoretically as shown in part (e) of FIG. 5. However, the amplitude V of the detection signals Vsinθ and Vcosθ that are output from the detector may vary due to a temperature variation or a variation in performance of the operational amplifiers. If the reference signal for comparison with the judgment signal $S_x$ is so generated as to vary in proportion to the amplitude V of the signals $S_j$ and $S_{j-1}$ as in the case of $\Delta S_j$ in the above embodiment, the influence on the interpolation pitch error can greatly be reduced, which enables provision of an interpolation pulse generating device having high accuracy and resolution.

As described above, according to the invention, the interpolation is performed in two stages, i.e., M-division and n-division, and it is utilized that a sine wave can be regarded as approximately straight in the vicinity of a phase 0°. Therefore, a simple, less expensive interpolation pulse generating device that operates at high speed and has high accuracy and resolution can be provided by using a smaller number of high-accuracy resistors and switching circuits of two stages (M and n).

What is claimed is:

1. An interpolation pulse generating device that receives detection signals of a plurality of phases which signals are produced in accordance with a displacement of relative movement between corresponding members, and generates a count pulse for each predetermined phase-angle pitch that is smaller than one period of the detection signals, comprising:

adjacent two phase selector for generating signals $S_j$ and $S_{j-1}$ that deviate from each other by a phase value of 2

π/M by combining the plurality of detection signals, where M is a fixed integer;

difference signal generating means for generating a reference signal ΔS that represents a difference between the signals $S_j$ and $S_{j-1}$; and comparator for generating an up-pulse or a down-pulse every time the signal $S_j$ or $S_{j-1}$ varies by ΔS/n where n is a fixed integer in a phase section of 2 π/M in which the signals $S_j$ and $S_{j-1}$ have values existing on both sides of 0.

2. The interpolation pulse generating device according to claim 1, further comprising:

n-ary counting means for outputting a first count value and a carry or borrow pulse by counting the up-pulse and the down-pulse, the first count value being used to control the comparing means; and M-ary counting means for outputting a second count value by counting the carry pulse and the borrow pulse, the second count value being used to control the adjacent two phases selecting means.

3. An interpolation pulse generating device that receives detection signals of a plurality of phases which signals are produced in accordance with a displacement of relative movement between corresponding members, and generates a count pulse for each predetermined phase-angle pitch that is smaller than one period of the detection signals, comprising:

adjacent two phase selecting means receiving two sinusoidal detection signals that have the same amplitude, the same spatial period, and a predetermined spatial phase difference and that vary symmetrically with respect to a zero level, for selecting, from M sinusoidal signals $S_1$-$S_M$ deviating from each other at predetermined intervals, two adjacent sinusoidal signals $S_j$ and $S_{j-1}$ where an integer j=1, 2, . . . , M, by combining the two sinusoidal detection signals;

difference signal generating means for generating a difference signal ΔS/n according to $$\Delta s_j /n = (S_{j-1} - S_j)/n$$

where n is a fixed integer;

kΔS/n generating means for generating a signal kΔS/n where k is an integer;

judgment signal generating means for generating, based on the sinusoidal detection signal $S_{j-1}$ and the signal kΔS/n, a judgment signal $S_x$ according to $$S_x = \{kS_j + (n-k)S_{j-1}\}/n;$$

first comparing means for outputting a down-pulse P_ if the judgment signal $S_x$ is smaller than 0;

second comparing means for outputting an up-pulse P_+ if the judgment signal $S_x$ is larger than ΔS/n;

n-ary counting means for decrementing the integer k by 1 when receiving the down-pulse P_ and, in the event that a decremented result is equal to 0, substituting n into k and outputting a borrow pulse, and for incrementing the integer k by 1 when receiving the up-pulse P_+ and, in the event that an incremented result is equal to n+1, substituting 1 into k and outputting a carry pulse, a k indicating signal being supplied to the kΔS/n generating means; and M-ary counting means for decrementing the integer j by 1 when receiving the borrow pulse and, in the event that a decremented result is equal to 0, substituting M into j, and for incrementing the integer j by 1 when receiving the carry pulse and, in the event that an incremented result is equal to M+1, substituting 1 into j, a j indicating signal being supplied to the adjacent two phase selecting means.

4. An interpolation pulse generating device that receives detection signals of a plurality of phases which signals are produced in accordance with a displacement of relative movement between corresponding members, and generates a count pulse for each predetermined phase-angle pitch that is smaller than one period of the detection signals, comprising:

adjacent two phase selecting means receiving two sinusoidal detection signals that have the same amplitude, the same spatial period, and a predetermined spatial phase difference and that vary symmetrically with respect to a zero level, for selecting, from M sinusoidal signals $S_1$-$S_M$ deviating from each other at predetermined intervals, two adjacent sinusoidal signals $S_j$ and $S_{j-1}$ where an integer j=1, 2, . . . , M, by combining the two sinusoidal detection signals;

difference signal generating means for generating a difference signal ΔS/n according to $$\Delta S/n = (S_{j-1} - S_j)/n$$

where n is a fixed integer;

judgment signal generating means for generating, based on the sinusoidal detection signal $S_{j-1}$ and the signal kΔS/n, a judgment signal $S_x$ according to $$S_x = \{kS_j + (n-k)S_{j-1}\}/n;$$

first comparing means for outputting a down-pulse P_ if the judgment signal $S_x$ is smaller than −ΔS/n;

second comparing means for outputting an up-pulse P_+ if the judgment signal $S_x$ is larger than 0;

n-ary counting means for decrementing the integer k by 1 when receiving the down-pulse P_ and, in the event that a decremented result is equal to 0, substituting n into k and outputting a borrow pulse, and for incrementing the integer k by 1 when receiving the up-pulse P_+ and, in the event that an incremented result is equal to n+1, substituting 1 into k and outputting a carry pulse, a k indicating signal being supplied to the kΔS/n generating means; and M-ary counting means for decrementing the integer j by 1 when receiving the borrow pulse and, in the event that a decremented result is equal to 0, substituting M into j, and for incrementing the integer j by 1 when receiving the carry pulse and, in the event that an incremented result is equal to M+1, substituting 1 into j, a j indicating signal being supplied to the adjacent two phase selecting means.

5. An interpolation pulse generating device that receives detection signals of a plurality of phases which signals are produced in accordance with a displacement of relative movement between corresponding members, and generates a count pulse for each predetermined phase-angle pitch that is smaller than one period of the detection signals, comprising:

adjacent two phase selecting means receiving two sinusoidal detection signals that have the same amplitude, the same spatial period, and a predetermined spatial phase difference and that vary symmetrically with respect to a zero level, for selecting, from H sinusoidal signals $S_1$-$S_M$ deviating from each other at predetermined intervals, two adjacent sinusoidal signals $S_j$ and $S_{j-1}$ where an integer $j=1, 2, \ldots, M$, by combining the two sinusoidal detection signals;

difference signal generating means for generating a difference signal $\Delta S_j$ according to $$\Delta S_j = S_{j-1} - S_j$$

and an inverted difference signal $-\Delta S_j$;

A/D-converting means for A/D-converting the sinusoidal signal $S_{j-1}$ using the signals $\Delta S_j$ and $-\Delta S_j$ as references;

comparing means for comparing an output A of an n-ary counting means and an output B of the A/D converting means, and for outputting an up-pulse $P_+$ if the output A is smaller than or equal to the output B, and outputting a down-pulse $P_-$ if the output A is larger than the output B;

n-ary counting means for decrementing the integer k by 1 when receiving the down-pulse $P_-$ and, in the event that a decremented result is smaller than 0, substituting n−1 into k and outputting a borrow pulse, and for incrementing the integer k by 1 when receiving the up-pulse $P_+$ and, in the event that an incremented result is equal to n, substituting 0 into k and outputting a carry pulse, a k indicating signal being supplied to the comparing means as the output A; and M-ary counting means for decrementing the integer j by 1 when receiving the borrow pulse and, in the event that a decremented result is equal to 0, substituting M into j, and for incrementing the integer j by 1 when receiving the carry pulse and, in the event that an incremented result is equal to M+1, substituting 1 into j, a j indicating signal being supplied to the adjacent two phase selecting means.

6. The interpolation pulse generating device according to claim 5, further comprising a damper circuit for generating a count-up pulse only when the up-pulse $P_+$ is generated consecutively, and a count-down pulse only when the down-pulse $P_-$ is generated consecutively, the count-up pulse and the count down pulse being supplied to the comparator instead of the up-pulse $P_+$ and the down-pulse $P_-$, respectively.

* * * * *

UNITED STATES PATENT AND TRADEMARK OFFICE
CERTIFICATE OF CORRECTION

PATENT NO. : 5,734,688

DATED : March 31, 1998

INVENTOR(S) : Mikiya TERAGUCHI and Kiyokazu OKAMOTO

It is certified that error appears in the above-indentified patent and that said Letters Patent is hereby corrected as shown below:

Title page, in item [56], References Cited, "FOREIGN PATENT DOCUMENTS", please add:

|  |  |  |
|---|---|---|
| --62-33527 | 07/1987 | Japan--; |
| --5-25285 | 04/1993 | Japan--; and |
| --0 213 904 | 11/1987 | European Pat. Off.--. |

Signed and Sealed this

Twenty-third Day of June, 1998

Attest:

BRUCE LEHMAN

Attesting Officer

Commissioner of Patents and Trademarks